US008564302B2

(12) United States Patent
Durston

(10) Patent No.: US 8,564,302 B2
(45) Date of Patent: Oct. 22, 2013

(54) TEST INSTRUMENTS FOR PULSE TDR, STEP TDR AND TRANSMISSION ANALYSIS

(75) Inventor: Thomas W. Durston, North Richland Hills, TX (US)

(73) Assignee: Greenlee Textron Inc., Providence, RI (US)

( * ) Notice: Subject to any disclaimer, the term of this patent is extended or adjusted under 35 U.S.C. 154(b) by 767 days.

(21) Appl. No.: 12/838,199

(22) Filed: Jul. 16, 2010

(65) Prior Publication Data

US 2011/0018547 A1 Jan. 27, 2011

Related U.S. Application Data

(60) Provisional application No. 61/227,143, filed on Jul. 21, 2009.

(51) Int. Cl.
*G01R 31/11* (2006.01)

(52) U.S. Cl.
USPC ............ 324/533; 324/532; 324/555; 324/534

(58) Field of Classification Search
USPC .......................................... 324/532–535, 555
See application file for complete search history.

(56) References Cited

U.S. PATENT DOCUMENTS

| 4,538,103 | A | * | 8/1985 | Cappon ........................ 324/534 |
| 5,396,444 | A | * | 3/1995 | Cannon et al. ................ 708/145 |
| 5,450,328 | A | * | 9/1995 | Janke et al. .................... 702/65 |
| 7,626,397 | B2 | * | 12/2009 | Opfer et al. ................... 324/509 |
| 2002/0089335 | A1 | | 7/2002 | Williams |
| 2003/0052697 | A1 | * | 3/2003 | James ........................... 324/555 |
| 2003/0058431 | A1 | | 3/2003 | Durston |
| 2004/0245998 | A1 | * | 12/2004 | Hyacinthe et al. ............ 324/534 |
| 2009/0021278 | A1 | * | 1/2009 | Khaira ......................... 324/765 |

FOREIGN PATENT DOCUMENTS

EP 1 248 444 10/2002

OTHER PUBLICATIONS

European Search Report which issued in connection with corresponding European Patent Application No. 10170237; Dated Mar. 28, 2011; Seven (7) pages.
A brochure for 1155-5000 Sidekick Plus Advanced Cable Maintenance Test Set; Copyright 2005; Two (2) pages.

(Continued)

*Primary Examiner* — Jermele M Hollington
*Assistant Examiner* — Temilade S Rhodes-Vivour
(74) *Attorney, Agent, or Firm* — Klintworth & Rozenblat IP LLC

(57) ABSTRACT

The test instrument is used to perform both time domain reflectometry (TDR) and analysis of transmission signals on a line under test. Further, the test instrument provides for both pulse TDR and step TDR. A coupling transformer having an enhanced low frequency response provides for coupling of the test instrument to the line under test. Isolation circuits between the coupling transformer and the line under test to prevent damage to the test instrument due to voltages on the line under test allow the test instrument to be used in connection with an active line under test. Two isolation circuits are utilized to maintain longitudinal balance of the circuit.

During step TDR, the positive and negative transmitter circuits provide step-shaped impulse signals. The enhanced low frequency response of the coupling transformer allows for transmission of step-shaped impulses, including the DC components of those signals, to the line under test and allows for transmission of reflected signals, including the DC components of those signals to the receivers.

The test instrument provides selectable impedance matching and provides for selectable attenuation levels.

20 Claims, 3 Drawing Sheets

(56) References Cited

OTHER PUBLICATIONS

A brochure for TEK 1500B Series Metallic Cable TDR's entitled "Tektronix Metallic TDR's for Cable Testing"; Six (6) pages; No date available.

A printout of AN201 Step vs. Pulse TDR Technology; by Paul Dewinter and Bill Ashley for AEA Technology Inc.; Two (2) pages; Copyright 2005.

A brochure for AEA Technology, Inc. 20/20 TDR; Two (2) pages; No date available.

* cited by examiner

TEST INSTRUMENTS FOR PULSE TDR, STEP TDR AND TRANSMISSION ANALYSIS

This application claims the domestic benefit of United States Provisional application Ser. No. 61/227,143, filed on Jul. 21, 2009, which disclosure is hereby incorporated by reference in its entirety.

BACKGROUND OF THE INVENTION

The telephone line testing principles described in this disclosure are based upon time domain reflectometry and are similar to the operation of radar. A signal is launched from a time domain reflectometer (TDR) connected to the line under test (LUT).

Time domain reflectometry is used for diagnosing problems in telephone and DSL circuits. A TDR operates by transmitting a signal on a transmission line and then monitoring the transmission line for any reflection of the signal. Reflections are caused by changes in the impedance along the transmission line. A change in impedance may indicate the presence of a fault. As a signal transmitted by a TDR reaches the impedance mismatch, a portion of the transmitted signal is reflected back to the TDR. Because the transmitted and reflected signals travel along the transmission line at a known speed of propagation, a precise location of the impedance mismatch may be determined by measuring the time at which the signal is transmitted and the time at which the reflected signal is received by the TDR.

The magnitude of the reflected signal is proportional to the magnitude of the impedance mismatch. The sign or polarity of the reflected pulse is determined by the direction of the change in impedance. For example, if the transmitted signal is positive and the impedance of the fault increases, then the reflected signal will be positive. A break in the line, for example, will result in strong positive reflected signal. If the transmitted signal is positive and the impedance at the fault decreases, then the reflected signal will be negative. A short in the line, for example, will produce a negative reflected pulse. Thus, the nature of the fault may be determined or inferred from analysis of the reflected waveforms.

The energy of the transmitted signal is dependent on the width of the signal. The larger the pulse width, the lower the frequency and the more energy is transmitted allowing the signal to travel further down the line. Accordingly, many currently available TDRs have a limited number of selectable pulse width settings. Each pulse setting produces pulses of substantially identical width.

Two types of TDR in use today are pulse TDR and step TDR. Pulse TDR, is commonly used in testing telecommunication lines. Pulse TDR provides an impulse wave shape to stimulate the LUT. Pulse TDR only provides a report of a differential response to impedance changes on the LUT. This differential response is typically adequate for detecting the end of the line, short circuits, or open circuits. Pulse TDR uses impulse which are pulse-shaped. The widths of the pulse-shaped impulses range from a few nanoseconds up to a few microseconds. Shorter impulse widths are used for short range testing (e.g. less than a few hundred feet) and longer impulse widths are used for longer range testing (e.g. thousands of feet). Pulse TDR is useful for approximating fault characteristics, but cannot measure line impedance and the exact nature of close-in faults. With pulse TDR there is no means of determining line impedance. Some line faults measured by pulse TDR result in complex waveforms shown on the screen that are difficult for the user to interpret. Thus, when a technician wants a better definition of the LUT they must use a second instrument such as a step TDR.

Step TDR is not commonly used in testing telecommunication lines due to high circuit complexity and sensitivity to damage from hazardous voltages found on the telecommunications lines. When Step TDR is performed, a step-shaped impulse is applied to the LUT. The step-shaped impulse starts with a very fast rising edge (e.g. a rise occurring in less than one nanosecond) and continues outputting a DC voltage on the LUT for up to a few microseconds. This technique results in an effective "traveling ohmmeter" as the step-shaped impulse propagates down the LUT. The fast rising edge and the following DC level are now tracked over time. As the step-shaped impulse encounters an impedance change, the reflected signal is measured as an offset to the nominal DC level, and provides a mechanism to report the impedance of the LUT inch by inch. This is much easier to interpret than pulse TDR and is capable of accurate measurement of faults on the LUT. Step TDR provides a direct impedance read out of the LUT over the range of interest, not possible with pulse (or differential) TDR methods. Step TDR is useful over shorter distances, typically up to several hundred meters depending on the quality of the LUT.

Certain step TDR devices have been provided for testing of telecommunications lines, such as for example a test sold by AEA under the trademark 20/20 TDR. These step TDR devices use a DC coupling method to the LUT. As a result, these conventional step TDR devices are not recommended on live tip/ring circuits due to likely damage from telephone line voltages. For this reason, the step TDR products currently on the market provide warnings and cautions concerning damage to these devices when used on phone lines and other sources of voltages. In addition, most step TDR instruments are sensitive to damage from voltages present on working telephone lines.

SUMMARY OF THE INVENTION

The test instrument provides for diagnoses of problems in telephone and DSL circuits. The test instrument can be utilized for performing TDR and for analysis of signals transmitted on the line under test. The test instrument includes a low frequency response coupling transformer which is coupled to the first and second conductors of the line under test through positive and negative side isolation circuits. The isolation circuits allow the test instrument to be utilized on the line under test while the line is active. The test instrument includes impulse drivers which provide signals having a variable impulse width to be utilized for performing the pulse TDR and step TDR functions. The low frequency response of the coupling transformer allows for transmission of the step-shaped impulse including the DC component of the step-shaped impulse to the line under test and for receipt of the DC component of the step-shaped impulse by the positive and negative receivers of the test instrument.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
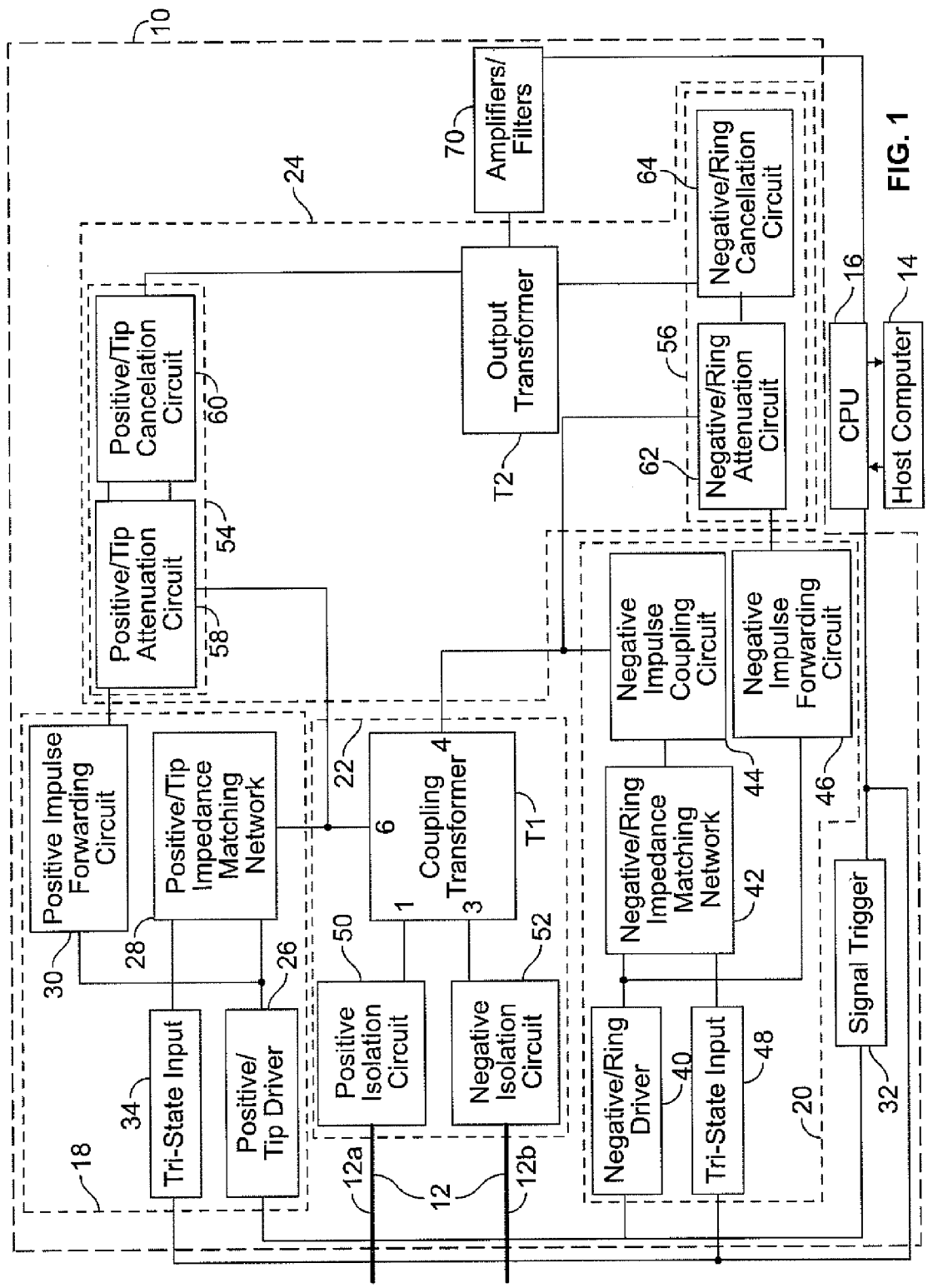
FIG. 1 is a block diagram of the test instrument in accordance with an embodiment of the test instrument shown relative to related components of a system in which the test instrument is used.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

A block diagram of the test instrument 10 is illustrated in FIG. 1. As shown in FIG. 1, the test instrument 10 provides for connection to a line under test 12, having a first conductor/tip 12a and a second conductor/ring 12b. As will be described herein, the test instrument 10 serves to acquire and process data relating to the line under test 12 or relating to signals transmitted on the line under test 12 and to transmit the data to a host computer system 14 through a central processing unit 16. The central processing unit 16 provides for communication of circuitry within the test instrument 10 and between the test instrument 10 and the host computer system 14. For ease of discussion, different portions or circuits within the test instrument circuit will be described. It is to be understood that each of these portions or circuits are not necessarily distinct portions but rather together form the test instrument circuit 10. It is also to be understood that it is not necessary that all of the portions of the test instrument 10 be located within a housing of the test instrument. For example, although the central processing unit 16 is illustrated as being separate from the test instrument 10, it is to be understood that the central processing unit 16 can be provided within the housing of the test instrument 10, within the host computer system, or else where. The host computer 14 may be coupled to the test instrument 10 using hardware interfaces and communication protocols known in the art.

As shown in FIG. 1, the test instrument circuit 10 generally includes a positive/tip side transmitter 18, a negative/ring side transmitter 20, a coupling circuit 22, and a complementary duplexer/receiver 24.

Positive Side Transmitter

The positive/tip side transmitter 18 generally includes a positive signal driver 26, a positive/tip side impedance matching network 28, and a positive impulse forwarding circuit 30. The positive/tip side transmitter 18 receives instruction from a signal trigger 32 and provides a signal path for impulse signal TDR_Pulse_POS_1 to the coupling circuit 22.

The positive signal driver 26 includes a logic chip, preferably a programmable logic chip such, as for example, an Altera Cyclone 3 FPGA. The positive signal driver 26 circuit provides the positive impulse signal TDR_PULSE_POS_1 to the positive/tip side impedance matching network 28. The positive signal driver 26 is capable of providing signals ranging from 20 Khz (25 microsecond impulse widths) to 200 Mhz (2.5 nanosecond impulse widths).

Figure 2A:
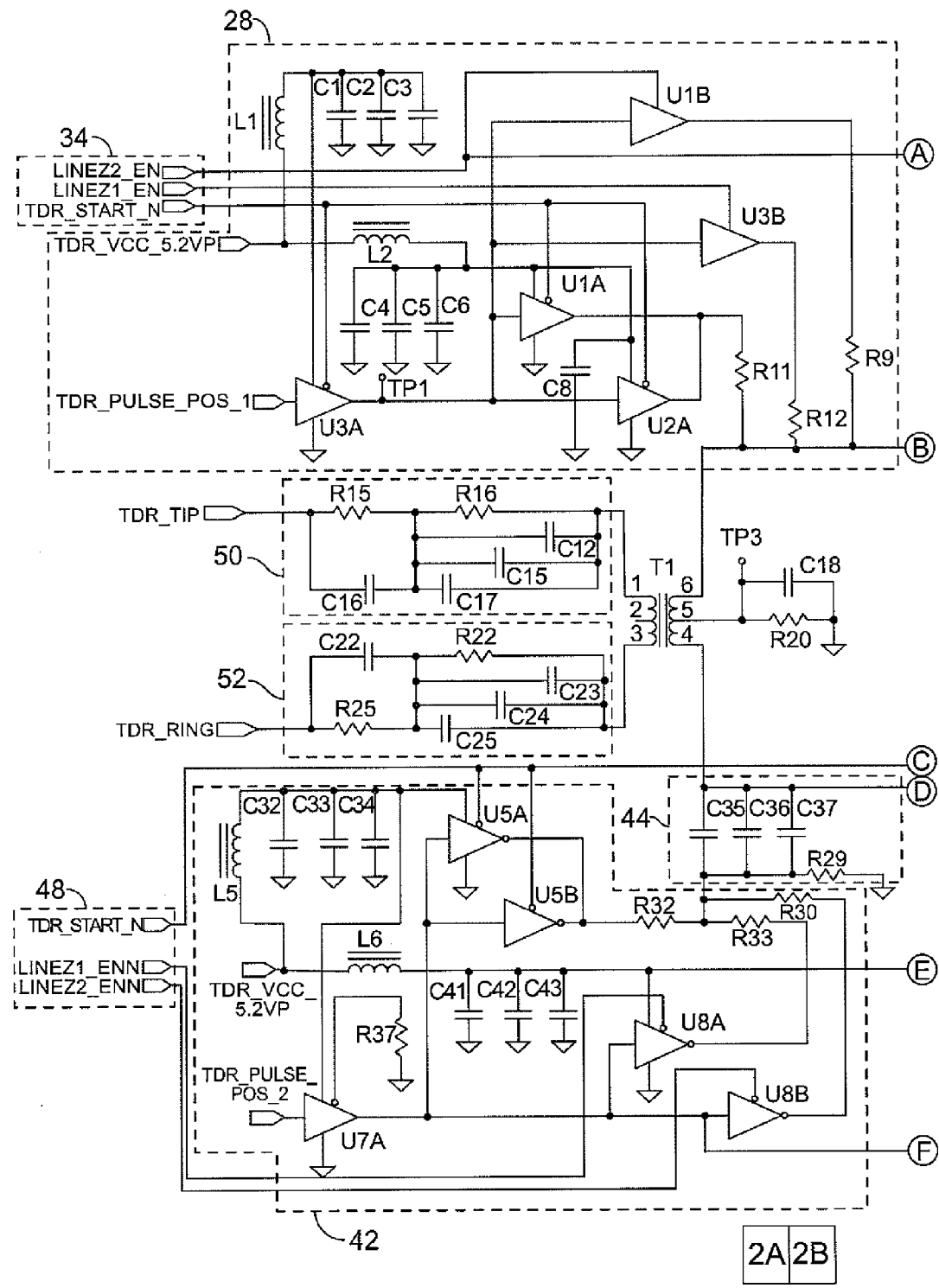
FIG. 2A is a portion of the circuit diagram of the test instrument of FIG. 1 a legend is provided in connection with FIG. 2A illustrating the relationship between FIGS. 2A and 2B.

As illustrated in further detail in FIG. 2A, the positive/tip side impedance matching network 28 includes charge storage and noise filtering capacitors, C1, C2 and C3, charge storage and noise filtering capacitors C4, C5 and C6, and charge storage and noise filtering capacitor C8. Capacitors C1 and C6 are preferably 1000 pF capacitors. Capacitors C2, C5 and C8 are preferably 0.1 µF capacitors. Capacitors C3 and C4 are preferably 22 µf capacitors.

The positive/tip side impedance matching network 28 also includes input buffer U3A and selectable buffers U1A, U1B, U2A, and U3B. Each of these buffers is preferably a SN74LVC2G241DCTR type tri-state logic level buffer/driver.

The positive side impedance matching network 28 also includes inductors L1 and L2. Inductors L1 and L2 are preferably MMZ1608R600A type inductors.

The positive side impedance matching network 28 includes selectable impedance resistors R9, R11, and R12. Resistor R9 is preferably a 365Ω resistor, resistor R11 is preferably a 162Ω resistor, and resistor R12 is preferably a 499Ω resistor. Preferably the tolerance of resistors R9, R11 and R12 is 0.5%.

As also shown in FIG. 2A, a tri-state enable input 34 is provided to the positive side impedance matching network 28 and allows for impedance selection in one of four arrangements. The tri-state enable input 34 includes a first input TDR_START_N, a second input LINEZ1_EN; and a third input LINEZ2_EN. Through selection of a combination of these impedance inputs, the impedance mode of the positive side impedance matching network 28 can be selected. For example, the impedance modes provided in TABLE 1 shown below can be selected for the circuit shown in FIGS. 2A and 2B.

TABLE 1

| Positive Impulse Driver Resistor | Impedance Mode | TDR_START_N (Active LOW) | LINEZ1_EN (Active HIGH) | LINEZ2_EN (Active HIGH) |
|---|---|---|---|---|
| R11 | 135 Ohms | Logic 0 (on) | Logic 0 (off) | Logic 0 (off) |
| R12 | 120 Ohms | Logic 0 (on) | Logic 1 (on) | Logic 0 (off) |
| R9 | 100 Ohms | Logic 0 (on) | Logic 0 (off) | Logic 1 (on) |
| R11, R12 and R9 | 90 Ohms | Logic 0 (on) | Logic 1 (on) | Logic 1 (on) |

Figure 2B:
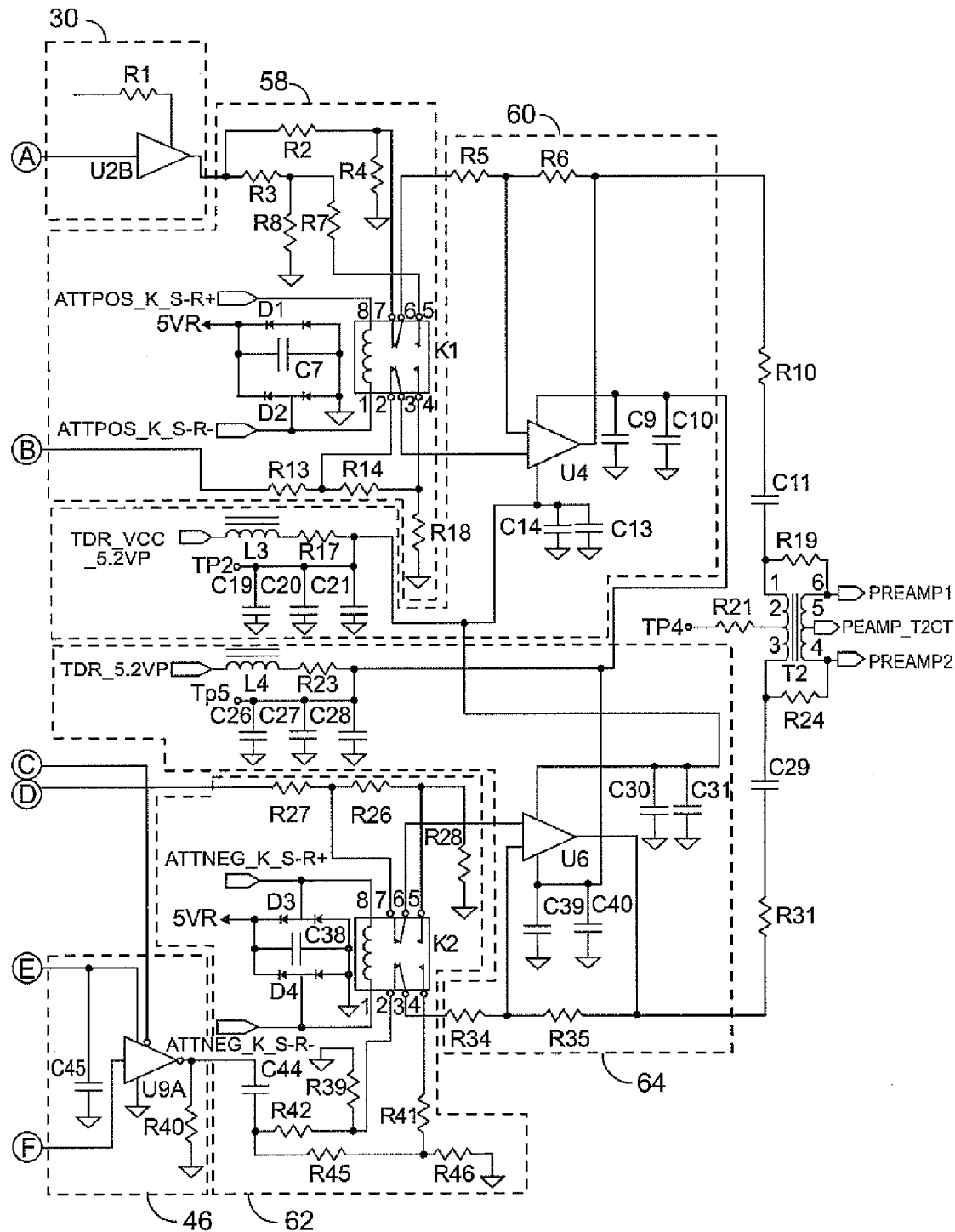
FIG. 2B is a portion of the circuit diagram of the test instrument of FIG. 1.

The positive impulse forwarding circuit 30 provides the impulse signal from the positive signal driver 26 to the duplexer/receiver 24 for cancellation of the impulse signal as will be described herein. As illustrated in FIG. 2B, the positive impulse forwarding circuit 30 includes a cancellation buffer U2B; which is preferably a SN74LVC2G241DCTR type tri-state logic level buffer/driver and a buffer enable resistor R1 which is preferably a 1KΩ resistor.

Negative Side Transmitter

The negative/ring side transmitter 20 generally includes a negative signal driver 40, a negative/ring side impedance matching network 42, a negative impulse coupling circuit 44, and a negative impulse forwarding circuit 46. The negative/ring side transmitter 20 receives instruction from the signal trigger 32 and provides a signal path for impulse signal TDR_PULSE_POS_2 to the coupling circuit 22.

The negative signal driver 40 includes a logic chip, preferably a programmable logic chip such as, for example, an Altera Cyclone 3 FPGA. The negative signal driver 40 provides the negative impulse signal TDR_PULSE_POS_2 to the negative/ring impedance matching network 42. The negative signal driver 40 is capable of providing signals ranging from 20 Khz (25 microsecond impulse widths) to 200 Mhz (2.5 nanosecond impulse widths)

As illustrated in further detail in FIG. 2A, the negative side impedance matching network 42 includes charge storage and noise filtering capacitors C32, C33 and C34; charge storage and noise filtering capacitors C41, C42 and C43, and charge storage and noise filtering capacitor C45. Capacitors C32 and C41 are preferably 22 µF capacitors. Capacitors C33, C43, and C45 are preferably 0.1 µF capacitors. Capacitors C34 and C42 are preferably 1000 pF capacitors.

The negative side impedance matching network 42 also includes input buffer U7A and selectable buffers U5A, U5B, U8A, and U8l3. Input buffer U7A is preferably a SN74LVC2G241DCTR type tri-state logic level buffer/driver. Selectable buffers U5A, U5B, U8A, and U8B are preferably SN74LVC2G240DCTR type tri-state logic level buffer/driver.

The negative side impedance matching network 42 includes inductors L5 and L6. Inductors L5 and L6 are preferably MMZ1608R600A type inductors.

The negative side impedance matching network 42 includes selectable impedance resistors R30, R32, R33 and input resistor R37. Resistor R30 is preferably a 365Ω resistor, resistor R32 is preferably a 162Ω resistor, and resistor R33 is preferably a 499Ω resistor. Buffer enable resistor R37 is preferably a 1 KΩ resistor. Preferably the tolerance of resistors R30, R32 and R33 is 0.5%.

As shown in FIG. 2, a tri-state enable input 48 is provided to the negative side impedance matching network 42 and allows for impedance selection in one of four arrangements. The tri-state enable input 48 includes a first input TDR_START_N, a second input LINEZ1_ENN, and a third input LINEZ2_ENN. Through selection of a combinations of these impedance inputs, the impedance mode of the negative side impedance matching network 42 can be selected. For example, the impedance modes provided in TABLE 2 shown below can be selected for the circuit shown in FIGS. 2A and 2B.

TABLE 2

| Negative Impulse Driver Resistor | Impedance Mode | TDR_START_N (Active LOW) | LINEZ1_ENN (Active LOW) | LINEZ2_ENN (Active LOW) |
|---|---|---|---|---|
| R32 | 135 Ohms | Logic 0 (on) | Logic 1 (off) | Logic 1 (off) |
| R33 | 120 Ohms | Logic 0 (on) | Logic 0 (on) | Logic 1 (off) |
| R30 | 100 Ohms | Logic 0 (on) | Logic 1 (off) | Logic 0 (on) |
| R32, R33 and R30 | 90 Ohms | Logic 0 (on) | Logic 0 (on) | Logic 0 (on) |

The negative impulse coupling circuit 44 includes isolation capacitors C35, C36 and C37 and isolation resistor R29. Isolation capacitor C35 is preferably a 22 µF capacitor, isolation capacitor C36 is preferably a 0.1 µF capacitor and isolation capacitor C37 is a preferably a 1000 pF capacitor. Isolation resistor R29 is preferably a 2.21 KΩ resistor. The negative impulse coupling circuit 44 serves to avoid saturation of the coupling transformer by blocking DC current flowing between selectable buffers U5A, U5B, U8A and U8B of the negative side transmitter 20 to selectable buffers U1A, U1B, U2A, and U3B of the positive side transmitter 18. In addition, the negative impulse coupling circuit 44 serves to prevent idle current from flowing from the selectable buffers U5A, U5B, U8A, and U8B of the negative side transmitter 20 to selectable buffers U1A, U1B, U2A, and U3B of the positive side transmitter 20 thereby preventing drainage of the batteries used to power of the test instrument 10 when impulses are not being provided by the drivers 26, 40.

The negative impulse forwarding circuit 46 provides the impulse signal from the negative signal driver 40 to the duplexer/receiver 24 for cancellation of the impulse signal as will be described herein. As illustrated in FIG. 2B, the negative impulse forwarding circuit 46 includes a forwarding buffer U9A and a charge storage and noise filtering capacitor C45. Forwarding buffer U9A is preferably a SN74LVC2G240DCTR type tri-state logic level buffer/driver and charge storage and noise filtering capacitor C45 is preferably a 0.1 µF capacitor.

Coupling Circuit

The coupling circuit 22 includes a coupling transformer T1, a positive/tip side isolation circuit 50, and a negative/ring side isolation circuit 52. The coupling circuit 22 receives signals from the positive/tip side and negative/ring side transmitters 18, 20 and provides the signals to the line under test 12. The coupling circuit 22 also receives signals from the line under test 12 and passes the received signals to positive/tip side receiver 18 and to the negative/ring side receiver 20. The signals received from the line under test 12 may be reflected impulse signals which are analyzed using TDR or signals such as broad band transmission signals to be analyzed through other methods.

The coupling transformer T1 is shown in further detail in FIG. 2A and is preferably a wide band transformer with extended low frequency response, such as for example, a ISD-1373 type transformer. Capacitor C18 and resistor R20 provide a ground reference for the coupling transformer T1. Capacitor C18 is preferably a 1000 pF capacitor. Resistor R20 is preferably a 100Ω resistor. Coupling transformer T1 includes test instrument side connections at pins 4 and 6 and line under test side connections at pins 1 and 3.

The positive/tip side isolation circuit 50 includes capacitors C12, C15, C16, C17, and resistors R15 and R16. Capacitors C12, C15 and C17 are each preferably 4.7 µF capacitors. Capacitor C16 is preferably 0.1 µF capacitors. Resistor R15 is preferably a 12.4Ω resistor and resistor R16 is preferably 3.01 MΩ resistor.

The negative/ring side isolation circuit 52 includes capacitors C22, C23, C24, C25 and resistors R22 and R25. Capacitor C22 is preferably a 0.1 µF capacitor. Capacitors C23, C24 and C25 are each preferably 4.7 µF capacitors. Resistor R22 is preferably a 3.01 MΩ resistor and resistors R25 is preferably a 12.4Ω resistor.

Complementary Duplexer/Receiver

The duplexer/receiver circuit 24 generally includes a positive side receiver 54, a negative side receiver 56, and an output transformer T2. The duplexer/receiver 24 receives transmission or reflected signals from the positive/tip 12a and negative/ring 12b of the line under test 12 for processing and communicates the transmission or reflected signals to the output side of the output transformer T2.

The positive side receiver 54 generally receives the transmission or reflected signals from the positive side of coupling transformer T1 and provides the signals to the input side of the output transformer T2. The positive side receiver 54 generally includes a positive/tip attenuation switch 58 and a positive/tip cancellation circuit 60.

As shown in FIG. 2B, the positive/tip attenuation switch circuit 58 includes a relay K1 which is preferably an IM42G relay having set and reset positions. When the relay K1 is in a reset position, the test instrument 10 provides TDR analysis of the reflected signals which are provided from the tip side of the coupling transformer T1 to the positive/tip cancellation circuit 60. The positive/tip attenuation switch circuit 58 also includes switch inputs ATT_POS_K_S−R+ and ATTPOS_K_S+R− for placing the attenuation switch K1 in either the set or reset mode. Diodes D1 and D2 and capacitor C7 are provided at the actuating coil terminals of the positive/tip attenuation switch K1. Diodes D1 and D2 are preferably BAV99 type diodes and capacitor C7 is preferably a 0.1 µF capacitor.

The positive/tip attenuation switch circuit 58 also includes 6 dB reference level attenuation resistors R2 and R4; 21 dB reference level attenuation resistors R3, R7 and R8; receive signal input resistor R13; and receive signal 6 dB and 21 dB attenuators resistors R14 and R18. 6 dB reference level attenuation resistors R2 and R4 are preferably 300Ω resistors; resistors R3 is preferably a 300Ω resistor; resistor R7 is preferably a 137Ω resistor; resistor R8 is preferably a 15.8Ω resistor; resistor R13 is preferably a 300Ω resistor; resistor R14 is preferably a 270Ω resistor; and resistor R18 is preferably a 30Ω resistor. Preferably resistors R2, R4, R3, R7, R8, R13, R14 and R18 each have a tolerance of 0.5%.

The positive/tip cancellation circuit 60 receives from the positive/tip attenuation switch circuit 58 the positive impulse signal and the positive/tip reflected signal if TDR is used or the positive/tip transmission signal if TDR is not being used. The positive/tip cancellation circuit 60 serves to remove the impulse signal from the reflected or transmission signal and pass the resulting signal to the output transformer T2.

As shown in FIG. 2B, the positive/tip cancellation circuit 60 includes cancellation amplifier U4. The cancellation amplifier U4 is preferably a differential amplifier, such as, for example, a AD8009ARZ amplifier. The positive/tip cancellation circuit 60 also includes gain setting resistor R5 which is preferably a 150Ω resistor and feedback resistor R6 which is preferably a 300Ω resistor. Each of resistors R5 and R6 preferably have a tolerance of 0.5%. The positive/tip cancellation circuit also includes charge storage and noise filtering capacitors C9, C10, C13, C14, C19, C20, and C21; Capacitors C9 and C14 are preferably 0.1 µF capacitors; C10 and C13 are preferably 1000 pF capacitors; capacitor C19 is preferably a 22 µF capacitors; capacitor C20 is preferably a 0.1 µF capacitor, and capacitor C21 is preferably a 1000 pF capacitor.

The positive side tip cancellation circuit 60 also includes inductor L3 which is preferably MMZ1608R600A type inductor and resistor R17 which is preferably a 4.7Ω resistor.

The negative side receiver 56 generally receives the transmission or reflected signals from the negative side of coupling transformer T1 and provides the signals to the input side of the output transformer T2. The negative side receiver 56 generally includes a negative/ring attenuation switch 62 and a negative/ring cancellation circuit 64.

The negative/ring attenuation switch circuit 62 includes a relay K2 which is preferably an IM42G relay having set and reset positions. The relay K2 includes switch inputs ATTNEG_K_S−R+ and ATTNEG_K_S+R− for placing the attenuation switch K2 in either the set or reset mode. Diodes D3 and D4 and capacitor C38 are provided at the actuating coil terminals of the negative/ring attenuation switch K2. Diodes D3 and D4 are preferably BAV99 type diodes and capacitor C38 is preferably a 0.1 µF capacitor.

The negative/ring attenuation switch circuit 62 also includes 6 dB reference level attenuation resistors R42 and R39; 21 dB reference level attenuation resistors R45, R41 and R46; receive signal input resistor R27; and receive signal 6 dB and 21 dB attenuators resistors R26 and R28. Reference level attenuation resistors R42 and R39 are preferably 300Ω resistors; resistors R45 is preferably a 300Ω resistor; resistor R41 is preferably a 137Ω resistor; resistor R46 is preferably a 15.8Ω resistor; resistor R27 is preferably a 300Ω resistor; resistor R26 is preferably a 270Ω resistor; and resistor R28 is preferably a 30Ω resistor. Preferably each resistor R42, R39, R45, R41, R46, R27, R26 and 28 each have a tolerance of 0.5%.

The negative/ring cancellation circuit 64 receives from the negative/ring attenuation switch circuit 62 the negative impulse signal and the negative/ring reflected signal if TDR is used or the negative/ring transmission signal if TDR is not being used. The negative/ring cancellation circuit 64 serves to remove the impulse signal from the reflected or transmission signal and pass the resulting signal to the output transformer T2.

The negative/ring cancellation circuit 64 includes cancellation amplifier U6. The cancellation amplifier U6 is preferably a differential amplifier, such as, for example, a AD8009ARZ amplifier. The negative/ring cancellation circuit 64 also includes gain setting resistor R34 which is preferably a 150Ω resistor and feedback resistor R35 which is preferably a 300Ω resistor. Each of resistors R34 and R35 preferably have a tolerance of 0.5%. The negative/ring cancellation circuit 64 also includes charge storage and noise filtering capacitors C30, C31, C39, C40, C26, C27, and C28; Capacitors C31 and C39 are preferably 0.1 µF capacitors; C30 and C40 are preferably 1000 pF capacitors; capacitor C26 is preferably a 22 µF capacitors; capacitor C27 is preferably a 0.1 µF capacitor, and capacitor C28 is preferably a 1000 pF capacitor.

The negative/ring side cancellation circuit 64 also includes inductors L4 which is preferably MMZ1608R600A type inductor and resistor R23 which is preferably 4.7Ω resistor.

The output transformer T2 is preferably a ISD-1373 type transformer. As shown in FIG. 2B, a test instrument side of the output transformer T2 includes pins 1, 2, and 3 and an output side of the output transformer includes pins 4, 5, and 6. A resistor R21 is provided at the test instrument side of the output transformer T2. The resistor R21 is preferably a 4.7Ω resistor. Resistor R10 and capacitor C11 are provided at the positive/tip side of the output transformer T2. Resistor R10 is preferably a 49.9Ω resistor and capacitor C11 is preferably a 22 µF capacitor. Resistor R31 and capacitor C29 are provided at the negative/ring side of the output transformer T2. Resistor R31 is preferably a 49.9Ω resistor and capacitor C29 is preferably a 22 µF capacitor. Resistors 19 and R24 provide an option to bypass and remove the output transformer T2. Resistors R19 and R24 are preferably zero Ω resistors for direct coupling the receiver circuit to the following amplifier stages of the circuit.

Method of Operation

The circuit of the test instrument 10 provides a TDR mode of operation and a signal analysis mode. In either mode, the user begins by placing the leads in electrical communication with the tip and ring nodes of the test instrument and the tip and ring leads are connected to the tip and ring of the line under test 12. As shown, the transmitter circuits 18, 20 and receiver circuits 54, 56 of the test instrument circuit 10 are not directly coupled with the line under test 12. Rather, communication between the transmitter circuits 18, 20 and receiver circuits 54, 56 for the test instrument circuit 10 is provided through the coupling transformer T1 which protects the transmitter and receiver circuits from voltages present on the line under test 12. The test instrument circuit 10 can therefore be utilized on a live line under test 12 without the risk of damage to the test instrument circuit 10.

By providing the same components for the positive isolation circuit and the negative isolation circuit, high longitudinal balance is provided.

In either the TDR mode of operation or the signal analysis mode of operation the user may select the impedance and the attenuation levels to be utilized. To select impedance level of the impedance matching networks, the user utilizes the host computer system 14 to generate a tri-state enable signal from the CPU 16 which is simultaneously passed to the positive tri-state enable inputs 34 and the negative tri-state enable input 48 to select the impedance of the positive and negative impedance matching networks 28, 42 matching the impedance of each transmitter circuit 18, 20 with the impedance of the line under test 12 as provided in Tables 1 and 2. The impedance selections are steady-state for the duration of the test, until changed by the test system.

To select the attenuation level to be utilized, the inputs ATTPOS_K_S−R+ and ATTPOS_K_S+R− are used to place relay K1 in either the set or reset mode and the inputs ATTNEG_K_S−R+ and ATTNEG_K_S+R− are used to place relay K2 in either the set or reset mode. It is intended that K1 and K2 are set or reset simultaneously to provide balanced signal levels for attenuation circuits 58 and 62 When K1 and K2 are in the reset position, the attenuators reduce the received signals by only 6 dB. K1 and K2 are typically placed in the reset position when the test instrument is used in the TDR mode or for low-level signal analysis. When K1 and K2 are set, the attenuators reduce the received signal by 21 dB, allowing the test instrument to receive and analyze high level DSL signals.

TDR Mode of Operation

As noted above, when the test instrument is utilized to perform TDR analysis, typically relays K1 and K2 are placed in the reset positions to apply 6 dB attenuation to the reflected signals. In the TDR Mode of operation, reflected signals are provided from the test instrument connections at pins 4 and 6 of the coupling transformer T1 to positive and negative side receiver 54, 56.

The TDR Mode of operation is initiated by providing impulse signals at TDR_PULSE_POS_1 and TDR_PULSE_POS_2. If Pulse TDR is to be utilized, instructions are provided to the CPU 16 to provide a control signal to the signal trigger 32 instructing the initiation of a pulse-shaped impulse signal. If Step TDR is to be utilized, instructions are provided to the CPU 16 to provide a control signal to the signal trigger 32 instructing the initiation of a step-shaped impulse signal. Typically a technician will begin by using pulse TDR and if additional information is desired the user can follow-up with step TDR.

Pulse TDR

As noted above, for pulse TDR, the host computer system 14 is used to provide instruction to the CPU 16 which provides a control signal to the signal trigger 32 to initiate a pulse-shaped impulse signal. The digital drivers 26, 40 in response to the signal trigger, simultaneously initiate the positive impulse incident signal TDR_PULSE_POS_1 at the positive signal driver 26 and the negative impulse incident signal TDR_PULSE_POS_2 at the negative signal driver 40. These positive and negative incident signals provide pulse-shaped signals. The width of the impulse generally ranges from a nanosecond up to a few microseconds. Shorter impulse widths are generally used for shorter range testing, for example, less than 300 feet. Longer impulse widths are used for longer range testing, for example, up to 18,000 feet. To conduct pulse TDR for a telephone line having a length of 1000 feet, for example, a 10 MHz signal can be used having an impulse width of 50 nano seconds. The impulse drivers 26, 40 provide a flat-topped square-wave impulse consisting of a fast rise-time, preferably less than 2 nanoseconds, and a fast fall time preferably less than 5 nanoseconds.

As shown in FIGS. 2A and 2B, the positive pulse incident signal TDR PULSE_POS_1 of the positive/tip driver 26 is provided to the buffer U2B of the positive impulse forwarding circuit 30 and is used to cancel the positive impulse incident signal from a reflected signal as will be described herein. The positive impulse incident signal of the positive/tip driver 26 is also provided to the input buffer U3A where it is then passed to the selected buffer U1A and U2A, U1B or U3B of the positive impedance matching network 28 and then to the instrument side of the coupling transformer T1. More specifically, the impulses provided by the positive/tip driver 26 are amplified by the non-inverting buffers U1A, U1B, U2A, U3A and U3B and provided to the coupling transformer T1 by selectable impedance resistors of the positive impedance matching network 28. The resulting signal is a positive impulse from 0V to +5V at the outputs of the buffers U1A and U2A, U1B and U3B and 0 to +2.5 volts at pin 6 of the coupling transformer T1.

The negative impulse incident signal TDR_PULSE_POS_2 of the negative/ring driver 40 is provided to the buffer U9A of the negative impulse forwarding circuit 46 and is used to cancel the negative impulse incident signal from a reflected signal as will be described herein. The negative impulse incident signal of the negative/ring driver 40 is also provided to the input buffer U7A where it is then passed to the selected buffer U5A and U5B, U8A or U8B of the negative impedance matching network 42. The negative impulse incident signal is then passed to the negative impulse coupling circuit 44 prior to being provided to the instrument side of the coupling transformer T1. Capacitors C35, C36 and C37 of the negative impulse coupling circuit 44 serve to isolate the positive side of the coupling transformer T1 from the negative side of the coupling transformer T1 to avoid saturation of the coupling transformer T1. More specifically, the impulses provided by the negative/ring driver 40 are amplified by the inverting buffers U5A, U5B, U8A, and U8B and provided to the coupling transformer T1 by selectable impedance resistors of the negative impedance matching network 42. The resulting signal is a negative impulse from +5V down to 0V at the outputs of the buffers and 0V to −2.5V (coupled by capacitors C35, C36, and C37) at pin 4 of the coupling transformer T1.

A resulting 5V impulse is provided across pins 4 and 6 on the instrument side of the coupling transformer T1 and is translated to pins 1 and 3 at the line under test side of the coupling transformer T1 and to the positive and negative isolation circuits 50, 52 prior to transmission to the positive and negative conductors 12a, 12b of the line under test 12.

Signals reflected by the positive/tip 12a of the line under test 12 are then provided to the line under test side of the coupling transformer T1 through the positive isolation circuit 50. Signals reflected by the negative/ring 12b of the line under test 12 are provided to the line under test side of the coupling transformer T1 through the negative isolation circuit 52. Use of the positive side isolation circuit and the negative side isolation circuit provides high longitudinal balance and will not disrupt the line under test. The reflected signals are received at the line under test side of the coupling transformer T1 and are translated to the test instrument side of the coupling transformer T1

The positive side reflected signal is provided by the coupling transformer T1 to the positive/tip attenuation circuit 58 and the negative side reflected signal is provided to the negative/tip attenuation circuit 62. As described above, and as shown in FIG. 2B the positive/tip attenuation circuit includes a switch K1. During pulse TDR, the switch K1 is placed in the reset mode and the positive side reflected signal is provided from pin 6 of the coupling transformer T1 to pin 2 of the switch K1. The reflected signal is then passed from pin 2 of the switch K1 to pin 3 of the switch K1 and to the cancellation amplifier U4 of the positive/tip cancellation circuit 60. The positive impulse incident signal is passed from the buffer U2B of the positive impulse forwarding circuit 30 to pin 7 of the switch K1. The positive impulse incident signal is passed from pin 7 of switch K1 to pin 6 of K1 and to the cancellation amplifier U4 of the positive tip/cancellation circuit 60. In this TDR mode the switch K1 provides for an attenuation level of −6 dB. The cancellation amplifier U4 outputs the difference between the positive impulse incident signal and the positive reflected signal to remove the positive incident signal from the reflected signal.

As described above, and as shown in FIG. 2B the negative/ring attenuation circuit includes a switch K2. During pulse TDR, the switch K2 is placed in the reset mode and the negative side reflected signal is provided from pin 4 of the coupling transformer T1 to pin 7 of the switch K2. The reflected signal is then passed from pin 7 of the switch K2 to pin 6 of the switch K2 and to the cancellation amplifier U6 of the negative/ring cancellation circuit 64. The negative impulse incident signal is passed from the buffer U9A of the negative impulse forwarding circuit 46 to pin 2 of the switch K2. The negative impulse incident signal is passed from pin 2 of switch K2 to pin 3 of switch K2 and to the cancellation amplifier U6 of the negative/ring cancellation circuit 64. In this TDR mode the switch K2 provides for an attenuation level of −6 dB. The cancellation amplifier U6 outputs the difference between the negative impulse incident signal and the negative reflected signal to remove the negative incident signal from the reflected signal.

The positive and negative reflected signals output from the amplifiers U4 and U6 (i.e. with the incident signal removed) are provided to the instrument side of the output transformer T2. The output transformer translates the reflected signals to the output side of the output transformer T2.

As shown in FIG. 1, the output transformer T2 passes the reflected signals to the amplification and filtering circuitry prior to providing the signals to the CPU 16 and host computer 14 for processing. This impulse TDR circuit provides a differential response to impedance changes on the line under test 12 which can be displayed and analyzed using the host computer 14. This differential response is adequate for detecting the end of the line, short circuits, or open circuits. When the technician desires a measurement of the line impedance, a more precise identification of the nature of "close-in" faults, or, for example, a clearer picture of the quality of inside wiring the technician can use the step TDR mode of operation.

Step TDR

In the step TDR mode of operation the circuit functions in the same manner as with the pulse TDR mode of operation with the exception that in the step TDR mode, the host computer system is used to provide instruction to the CPU which provides a control signal to the signal trigger 32 to initiate a step impulse signal. The digital driver, in response to the signal trigger, initiates the positive step-shaped incident impulse signal TDR_PULSE_POS_1 at the positive signal driver and the negative step incident signal TDR_PULSE_POS_2 at the negative signal driver.

Unlike the digitally generated impulse signal used in the pulse TDR mode described above, which provides a pulse-shaped wave to stimulate the line under test, in the step TDR mode, a step-shaped impulse is applied to the line under test. The digitally generated step-shaped impulse begins with a very fast rising edge and continues outputting a constant DC voltage on the line under test for a period of time. The step-shaped impulse is provided with sufficient DC level duration and minimum droop to create a step TDR function, effectively creating a traveling ohmmeter as the step signal propagates down the line under test. The fast rising edge and the following DC signal are tracked and sampled by the receiver 24 and CPU 16 for the duration of the step-shaped impulse. Preferably the rising edge of the impulse is sufficiently steep to achieve the desired DC voltage in less than 1 nanosecond and the constant DC voltage of the impulse is provided for up to a few microseconds. Preferably, for step TDR the impulse width is at least 3 microseconds. If, however, a impulse width of 3 microseconds is insufficient to provide analysis of the line length of interest, a longer impulse width can be used, for example a impulse of width of approximately 6 microseconds may be beneficial. When utilizing the step TDR mode of operation, it has been found that an impulse width of approximately 7 microseconds is sufficiently wide to provide for analysis for lengths of telephone line typically of interest. In some instances, however, a longer period impulse step width may be beneficial, for example, approximately 10 microseconds for longer range testing.

The coupling transformer T1 provides enhanced low frequency response which allows transmission of DC energy provided by the step-shaped impulse for at least 3 microseconds. Preferably the low frequency coupling transformer will provide for transmission of DC energy of more than 10 microseconds. The time constant provided by capacitors C12, C15, C16 and C17 and resistors R15 and R16 of the positive isolation circuit 50 is sufficiently large to allow for the transmission of the DC energy of the positive side step-shaped impulse to the positive conductor 12a of the line under test 12 prior to the capacitors being charged. Likewise the time constant provided by the capacitors C22, C23, C24 and C25 and resistors R22 and R25 of the negative isolation circuit 52 is sufficiently large to allow for the transmission of the DC energy of the negative side step-shaped impulse prior to charging of the capacitors, allowing for the transmission of the DC energy to the negative conductor 12b of the line under test 12 prior to the capacitors being charged.

The step-shaped impulse signals applied to the line under test are reflected back to the test instrument and are received by positive isolation circuit 50 and the negative isolation circuit 52. Use of the positive side isolation circuit 50 and the negative side isolation circuit 52 provides high longitudinal balance and will not disrupt the line under test. Again the time constant provided by the positive and negative isolation circuits 50, 52 is sufficient to allow the DC energy of the reflected signals to be passed to the line under test side of the coupling transformer T1. The coupling transformer T1 which has an extended low frequency response allows the DC component of the step-shaped impulse signal to be transmitted and sustained for longer impulse widths with negligible droop or error. The coupling transformer T1 transfers the reflected signals including the DC energy of the reflected signals from the line under test side of the coupling transformer T1 to the test instrument side of the coupling transformer T1.

Processing of the reflected positive and negative step-shaped impulses for step TDR by the duplexer/receiver 24 is the same as processing of the reflected positive and negative impulses for pulse TDR. When the reflected step TDR impulses are provided to the output transformer T2, however, the reflected signals will include an offset from the nominal DC level. This offset provides a mechanism to calculate the direct impedance rather than the differential impedance provided by the pulse TDR method. This direct impedance measurement is provided over the range of interest. Thus, providing a direct impedance analysis of the line under test 12 on an inch-by-inch basis.

Transmission of the step-shaped impulse signals to the line under test is accomplished while the circuitry of the test instrument 10 is fully protected against normal and hazardous telephone line voltages, including protection against transient voltages over several hundred volts peak.

Signal Analysis Mode of Operation

In addition to providing TDR analysis of the line under test 12, the test instrument 10 can be used to provide analysis of the communication signals on the line under test 12. To operate in the signal analysis mode, a control signal is initiated by the user at the host computer 14 and provided to the CPU 16. The CPU 16 forwards the control signal to place the positive side driver 18 and the negative side driver 20 in a "quiet" active termination mode. In this active termination mode the TDR pulses are not activated i.e. no impulses are provided at TDR_PULSE_POS_1 and TDR_PULSE_POS_2.

In the signal analysis mode, the selectable impedance settings of the impedance matching networks 28, 42 can be set to the desired terminating impedance to provide accurate signal level measurements. As noted above, the user utilizes the host computer system 14 to generate a tri-state enable signal from the CPU 16 which is simultaneously passed to the positive tri-state enable input 34 and the negative tri-state enable input 48 to select the impedance of the positive and negative impedance matching networks 28, 42 matching the impedance of each transmitter circuit 18, 20 with the impedance of the line under test 12 as provided in Tables 1 and 2. The impedance selections are steady-state for the duration of the test, until changed by the test system.

As also noted above, switches K1 and K2 provide selectable attenuation levels. Utilizing the host computer system and the inputs ATTPOS_K_S−R+ and ATTPOS_K_S+R− switch K1 is positioned in either the set or reset positions and the inputs ATTNEG_K_S−R+ and ATTNEG_K_S+R− are used to position switch K2 in either the set or reset position. For low-level signal analysis, i.e., high sensitivity signal analysis, switches K1 and K2 are typically placed in the reset position to provide only 6 dB attenuation and for high-level signal analysis, e.g. DSL signal analysis, K1 and K2 are typically placed in the set position, to provide 21 dB attenuation.

In the signal analysis mode utilizing 6 db attenuation, relays K1 and K2 are in the reset position. In this reset position, positive said transmission signals from first conductor/tip 12*a* of the line under test 12 are passed to pin 2 of switch K1, to output pin 3 of the switch K1, to positive amplifier U4 and to the test instrument side of the transformer T2. Likewise negative side transmission signals from second conductor/ring 12*b* of the line under test 12 are passed to pin 7 of switch K2, to output pin 6 of switch K2, to the negative amplifier U6, and to the test instrument side of the transformer T2. The output transformer T2 translates the transmission signals to the output side of the output transformer T2. As shown in FIG. 1, the transmission signals are then provided to the amplifier and filtering circuit 70, to the CPU 16 and to the host computer 14 for analysis by the user.

In the signal analysis mode utilizing 21 db attenuation, relays K1 and K2 are in the set position. In this set position, positive side transmission signals from first conductor/tip 12*a* of the line under test 12 are passed to pin 4 of switch K1, to output pin 3 of the switch K1, to the positive amplifier U4, and to the test instrument side of the transformer T2. Likewise negative side transmission signals from second conductor/ring 12*b* of the line under test 12 are passed to pin 5 of switch K2, to output pin 6 of switch K2, to the negative amplifier U6, and to the test instrument side of the transformer T2. The output transformer T2 translates the transmission signals to the output side of the output transformer T2. As shown in FIG. 1, the transmission signals are then provided to the amplifier and filtering circuit 70, to the CPU 16 and to the host computer 14 for analysis by the user.

The invention provides a single test instrument 10 which features pulse TDR functionality, step TDR functionality, and transmission signal analysis (e.g. amplitude measurement, spectral analysis, DSL band analysis, interfering noise analysis). In particular, the invention combines two TDR technologies and wideband DSL transmission signal analysis into a single test instrument 10 using a common circuit, control system and user interface. The pulse TDR function of the test instrument circuit 10 provides the user with the ability to quickly identify basic line faults, including opens, shorts, and end of the line at ranges up to 18,000 feet. The step TDR function can be utilized for shorter distances and provides a more precise characterization of faults identified using the pulse TDR function. When used in connection with these shorter distances, the step TDR function of the test instrument 10 provides an inch-by-inch direct impedance read out of the line under test. The step TDR function is beneficial for analyzing faults located within several hundred meters and therefore provides a particularly useful tool for analyzing inside wiring faults by providing a clearer picture of the inside wiring at the subscriber's premises than can be provided by simply using pulse TDR. Furthermore, unlike conventional step TDR devices, the test instrument 10 can be utilized in connection with a live line under test.

Technicians previously using only pulse TDR, including telecommunications technicians, CATV (phone over cable) technicians, electrical contractors, etc., will see a distinct advantage in using a single instrument with both step and pulse TDR features to clearly identify the location of faults and impedance properties of the line under test. Using a single instrument to perform both step and pulse TDR rather than a separate instrument for providing each function saves the technician time thereby allowing telephone service to be restored more readily. In addition, use of a single test instrument reduces equipment costs. The modifications required to add step TDR features to the currently available pulse TDR circuits will require relatively minimal additional material cost and relatively minimal modifications to the software and firmware while providing significant value to the customer.

These benefits of a single test instrument are further enhanced by also providing transmission signal analysis. The selectable impedance matching circuitry provided by the positive and negative side transmitter is utilized in the TDR modes is also used in the transmission signal analysis mode. In addition, the selectable attenuation circuitry utilized in the TDR mode is also employed for the transmission signal analysis mode.

Although high longitudinal balance is not necessary in typical TDR instruments, because the test instrument 10 is utilized for TDR and signal transmission analysis, high longitudinal balance of the circuit must be maintained. This balance results in improved longitudinal balance, resulting in a reduction of noise and improved data readings for both the TDR and transmission signal analysis modes of operation. Although typical TDR test instruments employ filters in the amplifier circuits 70 to eliminate noise, such filters can not be utilized in the current test instrument as the use of these noise reduction filters would eliminate portions of the transmission signals required for proper analysis of the transmission signals in the transmission signal analysis mode.

Although the test instrument 10 has been described for use in connection with testing a telecommunications line having first conductor or "tip" and a second conductor or "ring", it is to be understood that the test instrument 10 can be utilized for testing other types of lines, such as, for example, a coaxial cable.

While a preferred embodiment of the test instrument is shown and described, it is envisioned that those skilled in the art may devise various modifications of the test instrument without departing from the spirit and scope of the appended claims.

The invention claimed is:

1. A test instrument for testing of a line under test having a first conductor and a second conductor comprising:
    a coupling transformer having a line under test side and a test instrument side;
    a positive side DC isolation circuit providing an electrical connection between said line under test side of said coupling transformer and the first conductor of the line under test said positive side isolation circuit configured to provide transmission of broad band signals;
    a negative side DC isolation circuit providing an electrical connection between the line under test side of said coupling transformer and second conductor of the line under test said negative side isolation circuit being balanced with said positive side isolation circuit and configured to provide transmission of broad band signals;
    a positive side transmitter electrically connected to said test instrument side of said coupling transformer and including a positive side driver,
    a negative side transmitter electrically connected to said test instrument side of said coupling transformer and including a negative side driver,
    a positive side receiver electrically connected to said test instrument side of said coupling transformer for receiving a signal from said first conductor of the line under test; and
    a negative side receiver electrically connected to said test instrument side of said coupling transformer for receiving a signal from said second conductor of the line under test.

2. The test instrument of claim 1, further including an output transformer, wherein an input side of said output transformer receives signals from said positive side receiver and from said negative side receiver and on output side of said output transformer is in communication with a central processing unit.

3. The test instrument of claim 1, wherein said negative side transmitter further includes a negative impulse coupling circuit to prevent the flow of current from the positive side transmitter to the negative side transmitter.

4. The test instrument of claim 1, wherein said positive side transmitter includes a positive side selectable impedance circuit and said negative side transmitter includes a negative side selectable impedance circuit and wherein the impedance of said positive and negative side transmitter circuits can be selected to provide matching of the impedance of the transmitter circuits to the line under test.

5. The test instrument as defined in claim 1, wherein said positive side receiver circuit further comprises a positive side switch for selecting an attenuation level to be applied to said signal received from said first conductor and wherein said negative side receiver circuit further comprises a negative side switch for selecting an attenuation level to be applied to said signal received from said second conductor.

6. The test instrument of claim 5, wherein said positive side switch and said negative side switch are operated simultaneously.

7. The test instrument of claim 1, further including a central processing unit for selectively initiating pulse-shaped and step-shaped impulse signals from said positive and negative side transmitters; and wherein said positive side receiver receives a positive side reflected signal from said first conductor and said negative side receiver receives a negative side reflected signal from said second conductor.

8. The test instrument of claim 7, wherein said positive side transmitter includes a programmable logic chip for providing said impulse signal and said negative side transmitter includes a programmable logic chip for providing said impulse signal.

9. The test instrument of claim 7, wherein said positive side receiver further includes a positive cancellation circuit for cancelling said impulse signal from said positive side reflected signal and wherein said negative side receiver further includes a negative cancellation circuit for cancelling said impulse signal from said negative side reflected signal.

10. The test instrument of claim 7, wherein said positive side isolation circuit includes
    a capacitor and said negative side isolation circuit includes a capacitor and wherein a step-shaped impulse is provided to said positive side and negative side transmitters and said step-shaped impulse is applied to said first conductor, prior to said capacitor of said positive side isolation circuit being charged and wherein a step-shaped impulse is applied to said second conductor, prior to said capacitor of said negative side isolation circuit being charged.

11. The test instrument of claim 10, wherein said reflected signal from said first conductor is received by said positive side receiver prior to said capacitor of said positive side isolation circuit being charged and said reflected signal from said second conductor is received by said negative side receiver prior to said capacitor of said negative side isolation circuit being charged.

12. The test instrument of claim 7, wherein a frequency response of said coupling transformer is sufficiently low to provide for transmission of said impulse and reflected signals; and wherein a time constant of said positive side isolation circuit and a time constant of said negative side isolation circuit are sufficiently large to allow for transmission of a DC component of said impulse signals to the line under test and to allow for transmission of a DC component of said reflected signals to said receivers.

13. The test instrument as defined in claim 12, wherein said frequency response of said coupling transformer provides for transmission of impulse signals having a DC component lasting at least 3 microseconds.

14. The test instrument as defined in claim 12, wherein said frequency response of said coupling transformer provides for transmission of impulse signals having a DC component lasting at least 6 microseconds.

15. The test instrument of claim 12, wherein said time constant of said positive side isolation circuit and said time constant of said negative isolation circuit are at least 6 microseconds.

16. The test instrument of claim 12, wherein said time constant of said positive side isolation circuit and said time constant of said negative side isolation circuit are at least 10 microseconds.

17. A test instrument for testing of a line under test having a first conductor and a second conductor comprising:
    a coupling transformer having a line under test side and a test instrument side;
    a positive side DC isolation circuit providing an electrical connection between said line under test side of said coupling transformer and the first conductor of the line under test said positive side isolation circuit and configured to provide transmission of broad band signals;
a negative side DC isolation circuit providing an electrical connection between the line under test side of said coupling transformer and second conductor of the line under test, said negative side isolation circuit being balanced with said positive side isolation circuit and configured to provide transmission of broad band signals;
a positive side transmitter electrically connected to said test instrument side of said coupling transformer;
a negative side transmitter electrically connected to said test instrument side of said coupling transformer;
a positive side receiver electrically connected to said test instrument side of said coupling transformer for receiving signals from the first conductor of the line under test; and
a negative side receiver electrically connected to said test instrument side of said coupling transformer for receiving signals from the second conductor of the line under test;
wherein when the test instrument is in a transmission signal analysis mode, said positive side transmitter provides a positive side termination circuit and said negative side transmitter provides a negative side termination circuit; and
wherein when the test instrument is in a TDR mode, said positive side transmitter provides an impulse signal to be applied to the first conductor of the line under test, said negative side transmitter provides an impulse signal to be applied to the second conductor of the line under test, said positive receiver receives a positive reflected signal, and said negative receiver receives a negative reflected signal.

18. The test instrument of claim 17, wherein said positive side transmitter further includes a selectable impedance network and said negative side transmitter further includes a selectable impedance network.

19. The test instrument of claim 17, wherein said positive side receiver circuit further includes a positive side switch for selecting an attenuation level to be applied to said signal received from said first conductor and said negative side receiver circuit further includes a negative side switch for selecting an attenuation level to be applied to said signal received from said second conductor.

20. The test instrument of claim 17, wherein said negative side termination circuit is balanced with said positive side termination circuit.

* * * * *

UNITED STATES PATENT AND TRADEMARK OFFICE
CERTIFICATE OF CORRECTION

| | | |
|---|---|---|
| PATENT NO. | : 8,564,302 B2 | Page 1 of 1 |
| APPLICATION NO. | : 12/838199 | |
| DATED | : October 22, 2013 | |
| INVENTOR(S) | : Durston | |

It is certified that error appears in the above-identified patent and that said Letters Patent is hereby corrected as shown below:

In the Specification

In Column 4, Line 3, delete "22 µf" and insert -- 22 µF --, therefor.

In Column 5, Line 8, delete "U813." and insert -- U8B. --, therefor.

Signed and Sealed this
Sixth Day of May, 2014

Michelle K. Lee
*Deputy Director of the United States Patent and Trademark Office*